United States Patent [19]

Birx

[11] 4,227,153
[45] Oct. 7, 1980

[54] PULSE GENERATOR UTILIZING SUPERCONDUCTING APPARATUS

[75] Inventor: Daniel L. Birx, Santa Barbara, Calif.

[73] Assignee: The United States of America as represented by the Secretary of the Navy, Washington, D.C.

[21] Appl. No.: 928,218

[22] Filed: Jul. 26, 1978

[51] Int. Cl.² .................. H03K 3/55; H03K 5/12; H01P 7/06; H01J 17/64
[52] U.S. Cl. ................................ 328/59; 333/13; 333/20; 333/258; 307/277
[58] Field of Search ............... 333/13, 20, 99 S, 258; 307/277; 328/65, 59, 67

[56] References Cited

U.S. PATENT DOCUMENTS

| | | | |
|---|---|---|---|
| 2,810,830 | 10/1957 | Glass et al. | 333/13 X |
| 3,023,380 | 2/1962 | Hill | 333/258 X |
| 3,396,388 | 8/1968 | Goldie | 333/13 X |
| 3,845,424 | 10/1974 | Martens | 333/99 S |

*Primary Examiner*—John S. Heyman
*Attorney, Agent, or Firm*—R. S. Sciascia; L. I. Shrago

[57] ABSTRACT

High power, phase coherent pulses are generated by superconducting apparatus which includes a superconducting cavity resonator that is pumped by a low power microwave source while being isolated from a load. Switching of the cavity to an emitting mode is accomplished in 5 to 10 nanoseconds by firing a gas discharge tube that acts to couple the activity to the load while decoupling it from the pumping source.

2 Claims, 3 Drawing Figures

PULSE GENERATOR UTILIZING SUPERCONDUCTING APPARATUS

The present invention relates generally to apparatus for and methods of generating high power, phase coherent, microwave pulses which utilize superconducting elements.

In most conventional high power microwave pulse generators such as those utilized in planetary radar systems, for example, energy is initially stored electrostatically or in low frequency transmission lines. This energy is subsequently employed to accelerate an electron beam which in turn generates the microwave radiation. However, these systems require complicated control circuits for accomplishing the necessary pulse modulation, and this modulation becomes all the more difficult where the beams are of high intensity.

It is well known that superconducting resonators can maintain very high Qs at high field strengths. Thus, these resonators can directly store large amounts of microwave energy for relatively long periods of time. Because of this storage capability, high levels of microwave energy can be accumulated from low power sources and the sudden release of the stored energy can produce high power microwave pulses. However, the successful utilization of this technique requires a switching operation which preserves the very high Q of the storage apparatus during the accumulation of the microwave energy and establishes a low Q for the apparatus during the discharge cycle of the energy. It can be shown that maximum gain requires that the relative energy lost per cycle in the switching mechanism be less than the ratio of microwave pulse duration to the intrinsic resonator decay time.

It is, accordingly, an object of the invention to provide a high power microwave pulse generating system utilizing a superconducting resonator which is electrically Q switched into an emitting mode.

Another object of the present invention is to provide a microwave power gain arrangement employing a superconducting resonator as an energy storage means.

Another object of the present invention is to provide apparatus for producing high power, phase coherent, microwave pulses wherein a superconducting resonator serves as the energy storage device, and an electrical switching means is effective to both couple this resonator to an external load and decouple it from its power source.

Other objects, advantages and novel features of the invention will become apparent from the following detailed description of the invention when considered in conjunction with the accompanying drawings wherein.

Briefly, and in general terms, the above objects of invention are realized in one modification by initially pumping a superconducting resonator into a high energy state by means of a low power microwave source which has a frequency corresponding to the resonant frequency of the resonator. The energy stored in the resonator is suddenly released, and its discharge produces a high power microwave pulse that is phase coherent with the low power source. The Q switching of the resonator is accomplished by making use of wave interference effects which initially isolate the resonator from the external load during the charging cycle and decouple it from the charging source while coupling it to the external load during the discharge portion of the cycle.

Figure 1:
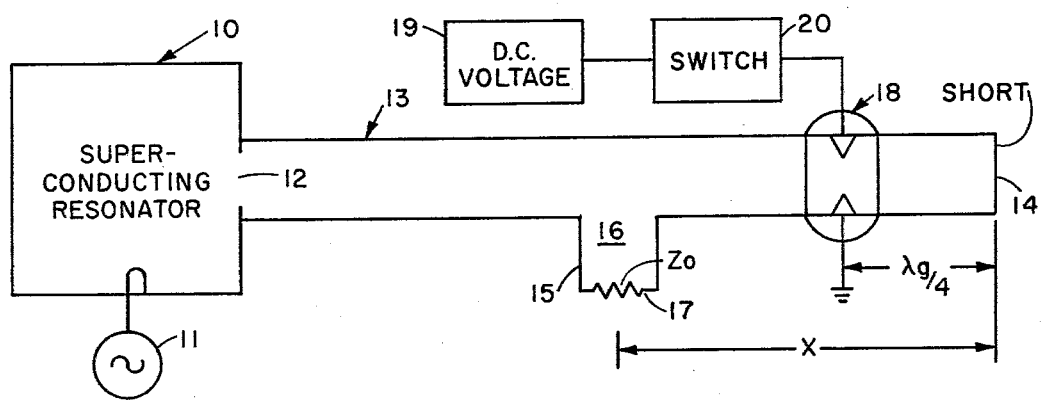
FIG. 1 is a schematic diagram of a preferred embodiment of the invention.

Referring now to FIG. 1 of the drawings, which illustrates a preferred embodiment of the invention, a superconducting resonator 10, which may be a lead plated copper cylindrical resonator, is adapted to be pumped to a high energy state by a low power microwave source 11 that is coupled to it in a conventional manner. To minimize surface electric fields, the resonator is excited in a transverse electric mode, such as the $TE_{012}$ mode. Microwave source 11, whose frequency corresponds to the resonant frequency $\omega$ in cavity 10, may provide either a CW signal or a pulsed signal having a duration sufficient to establish a high intensity microwave field within resonator 10.

Coupled to the resonator via a suitable aperture 12 formed in a sidewall portion thereof is a main rectangular waveguide section 13 that terminates at its remote end in a short circuit 14. A waveguide branch section 15 is attached to the narrow wall of main waveguide section 13, forming an H-plane junction, and a matched load 17, $Z_o$, which may be an antenna, terminates this branch.

Main waveguide 13 contains a gas discharge tube 18 which is positioned at quarter wavelength of the microwave signal $\lambda g/4$, or an odd multiple thereof, away from short circuit 14. The distance "X" between the short circuit 14 and the center of the waveguide branch 15 is $\lambda g/2$ or an even multiple of $\lambda g/4$. With such a spacing, it will be recognized, the standing wave present within waveguide 13 produced by the incident and reflected traveling waves will have a minimum electric field intensity at the input end of branch line 15, and a nodal condition, consequently, will exist at this entrance location. No electromagnetic energy, therefore, will be coupled from main waveguide 13 to the external load 17. In this condition, the microwave switching apparatus associated with resonator 10 is in an "open" state with external load 17 isolated from resonator 10 and microwave source 11. Thus, substantially all of the microwave power supplied to superconducting resonator 10 remains stored therein, and the resonator charges to a high microwave energy state.

To discharge the resonator and thereby generate the high power microwave pulse, the short circuit 14 is effectively displaced towards the branch line 16 by a distance corresponding to $\lambda g/4$. This is accomplished by ionizing the gas within discharge tube 18. By so shifting the shorting means, the standing wave now present within waveguide 13 will have a maximum electric field intensity at the entrance to the branch waveguide. Power, therefore, will flow from main waveguide section 13 to the external load 17, and when this occurs, the switching mechanism associated with the resonator is in a "closed" condition.

Gas discharge tube 18 may contain, for example, xenon, and its ionization is achieved by applying a suitable DC voltage from source 19 across a pair of internal electrodes by operating a switching device 20. As is well known, when there is no discharge within tube 18, this tube is effectively transparent to microwave energy and, consequently, the microwave energy present within main waveguide 13 is reflected at the short circuit 14. However, when the discharge is initiated, reflection occurs at this tube because of the low resistance of the discharge plasma. In one practical embodiment of the invention, the gas pressure within the tube and its discharge voltage were adjusted so that a switching time of less than $10^{-8}$ sec. was achieved with a "closed" state insertion loss of less than 1 db.

Instead of employing a high voltage pulse to fire the discharge tube, the microwave field present within the main waveguide can be used to bring about the tube's ionization. With such an arrangement, the power level of the output pulse will be determined by the gas pressure supplied to the tube.

It would be pointed out that the on/off ratio of the switching apparatus is determined by the degree of balance of the microwave "T" formed by the main waveguide 13 and the H-plane junction 16. This balance is limited by dissipation in the waveguide structure. Ratios of ~60 db have been attained with silver waveguides maintained at nitrogen temperature, and higher ratios can be obtained with superconducting components.

Figure 2:
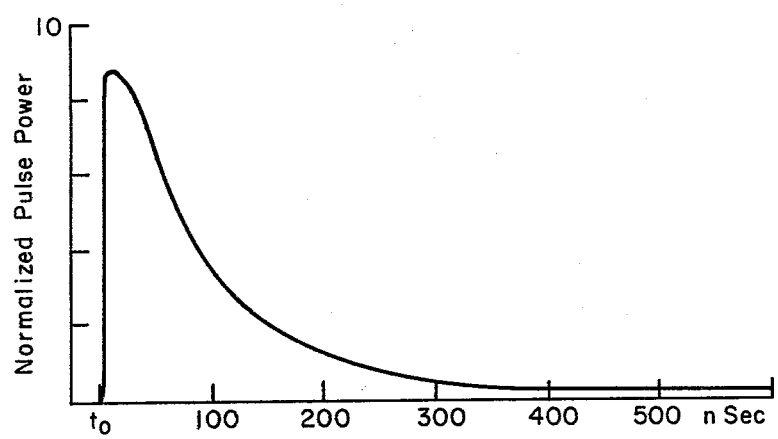
FIG. 2 is a plot of the output power normalized to the input power versus time.

FIG. 2 is a plot of the output pulse power normalized to the input power as measured in one experimental configuration of the invention by a crystal detector located at $Z_o$. The resonator volume was ~150 cm$^3$, the maximum input power ~1 watt, and the peak magnetic field ~10 gauss. As seen in this FIG., before the Q switching occured at time $t_o$, no power appeared at the detector, and the output load was isolated from the microwave source. However, when the gas discharge tube was activated—closing the switch—a 100 nanosec. Output pulse having a rise time of ~$10^{-8}$ sec., and a power gain of 10 was generated. This limited gain was the result of losses in the system caused by the room temperature condition of the waveguide components making up the switching mechanism. Power gains on the order of $10^6$ can be achieved, nevertheless, by utilizing superconducting waveguides and a helium gas in the discharge tube maintained at helium temperature.

After the Q switching, the power in the output pulse relaxed to that directly delivered by the microwave source then coupled relatively strongly to $Z_o$. However, this power level was much less than that of the source since this coupling is optimized for an "open" condition of the switching apparatus, i.e., with tube 18 non-ionized.

The switching mechanism of the present invention thus performs two functions: coupling the stored energy in the resonator to the external load and decoupling the resonator from the low power pumping source.

Figure 3:
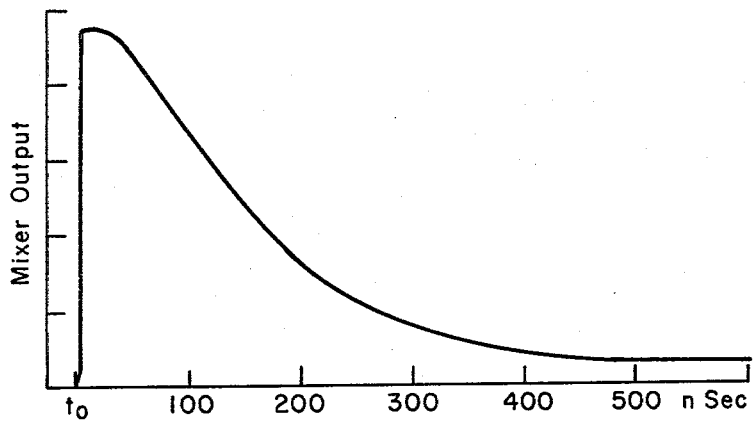
FIG. 3 is a plot of the output of a double balanced mixer having the output pulse and the microwave signal source as inputs.

FIG. 3 shows the experimental results of mixing the output pulse with a signal derived from the low power microwave source 11 in a double balanced mixer. If the two signals fed to this mixer are instantaneously phase and frequency coherent then the mixer output will be a DC signal that represents the time evolution of the amplitude of the output pulse. The time duration of the DC output from the mixer thus represents a lower limit on the phase persistence of a pulse at frequency $\omega$.

The similarity between FIGS. 2 and 3 indicates that the phase persistence of the output pulse was at least as long as the intrinsic decay time, $\tau_c$, of the resonator. Consequently, the switching technique employed in the present invention to charge and discharge the superconductor cavity resonator does not produce random phase shifts in the output pulses.

What is claimed is:

1. Apparatus for generating high power microwave pulses that have extremely fast rise times and are phase coherent with the signal from a microwave signal source, comprising in combination a superconducting cavity resonator;

means for coupling a low power microwave signal source to said cavity resonator to charge it to a high energy level, the frequency of said signal source corresponding to the resonant frequency of said cavity resonator;

a main waveguide section having one end thereof coupled to said cavity and the other end thereof terminating in a short circuit;

a branch waveguide section connected at one end to said main waveguide section at a location which is an even multiple of $\lambda g/4$ away from said short circuit, where $\lambda g$ is the wavelength of said microwave signal;

a load connected to the other end of said branch waveguide section and;

means for establishing at a particular time a short circuit condition across said main waveguide section at a location $\lambda g/4$ from said short circuit, the coupling between said mircowave signal source and said resonant cavity being optimized when no short circuit condition exists across said main waveguide section, the occurrence of said short circuit condition discharging said resonant cavity, generating a high power pulse which is phase coherent with the signal from said microwave signal source, and additionally decoupling said microwave signal source from said resonant cavity.

2. In an arrangement as defined in claim 1 wherein said superconducting cavity resonator is a cylindrical cavity excited in the $TE_{102}$ mode; and said means for establishing a short circuit condition across said main waveguide section includes a gas discharge tube containing an ionizable medium.

* * * * *